United States Patent
Truesdale

(10) Patent No.: US 6,700,366 B2
(45) Date of Patent: Mar. 2, 2004

(54) VERY FAST SWEPT SPECTRUM ANALYZER

(75) Inventor: Derek Truesdale, San Jose, CA (US)

(73) Assignee: Anritsu Company, Morgan Hill, CA (US)

(*) Notice: Subject to any disclaimer, the term of this patent is extended or adjusted under 35 U.S.C. 154(b) by 0 days.

(21) Appl. No.: 10/072,731

(22) Filed: Feb. 5, 2002

(65) Prior Publication Data

US 2003/0146743 A1 Aug. 7, 2003

(51) Int. Cl.$^7$ .................. G01R 25/00; G01R 13/24
(52) U.S. Cl. .................. 324/76.78; 324/76.27
(58) Field of Search .................. 324/76.23, 76.77, 324/76.78, 76.68, 76.28, 76.29, 76.44, 76.27, 615

(56) References Cited

U.S. PATENT DOCUMENTS 5,420,514 A * 5/1995 Wardle et al. .............. 324/615
5,594,344 A * 1/1997 Doyle et al. ................ 324/338

* cited by examiner

*Primary Examiner*—Albert Decady
*Assistant Examiner*—James Kerveros
(74) *Attorney, Agent, or Firm*—Fliesler Meyer LLP

(57) ABSTRACT

Analyzing a swept spectrum signal formed by mixing a ramping local oscillator and an input signal to generate an IF signal, the resulting IF signal having a phase change with respect to the input signal, the phase change including a quadratic portion. For analysis, the IF signal is processed such that the quadratic component of the phase change is removed. The quadratic component of the phase change is removed with a complex filter.

8 Claims, 3 Drawing Sheets

FIG. 1 - Prior Art

VERY FAST SWEPT SPECTRUM ANALYZER

INCORPORATION BY REFERENCE

The following United States Patent is hereby incorporated by reference in its entirety:

U.S. Pat. No. 5,117,179, entitled "Swept Signal Analysis Instrument and Method", filed on Mar. 13, 1990, issued May 26, 1992.

FIELD OF THE INVENTION

The present invention relates to signal processing systems. More particularly, the present invention relates to swept spectrum analyzers, and even more particularly to a method and apparatus for a very fast swept spectrum analyzer.

BACKGROUND

Swept spectrum analyzers have been in use for many years. FIG. 1 depicts one such swept spectrum analyzer system 100. The system 100 includes an RF signal input 10, mixing circuitry 20, intermediate frequency (IF) signal processing circuitry 30, and conversion circuitry 40. Mixing circuitry 20 includes a mixer 21 and a ramping local oscillator (LO) 22. IF processing circuitry 30 includes a resolution bandwidth (RBW)filter 31 and an analog-to-digital converter (ADC) 32.

The operation of system 100 shown in FIG. 1 is as follows. The RF signal input 10 is mixed with the LO using mixer 21 to form an IF signal output. The frequency of the LO signal from oscillator 22 is ramped to cause the IF signal to be swept. The IF signal is then filtered by RBW filter 31. Thus, the swept LO sweeps all the frequencies of the heterodyned-down input signal past the constant frequency of the RBW filter 31, thereby permitting the RBW filter 31 to resolve the input signal's spectral composition. The filtered IF signal is then converted to a digital signal by ADC 32. The digital representation of the IF signal is then processed by the conversion circuitry 40.

A typical conversion circuitry 40 of the prior art is shown in FIG. 2. Conversion circuitry 40 includes a first mixer 41, a signal generator 42, phase adjustment circuitry 43, a second mixer 44, and a real filter 45. The operation of conversion circuitry 40 shown in FIG. 2 is as follows. The processed IF signal is mixed at mixer 41 with a signal from numeric oscillator 42 to produce an in-phase signal, or I signal. The signal from numeric oscillator 42 is also processed by the phase adjustment circuitry 43 to produce a numeric oscillator signal that is 90° out of phase with the signal entering mixer 41. The signal output from the phase adjustment circuitry 43 is then mixed at mixer 44 with the processed IF signal to produce a quadrature signal, or Q signal. The quadrature signal is 90° out of phase with the I signal. The I signal and Q signal are then input into and filtered by real filter 45. The filtered I and Q output signals are then processed for display.

Swept signal analysis systems experience a common drawback in that measurement errors result from the sweeping operation. As the sweep speed increases, spectral components of the input signal are swept at increased speeds through the filter. Swept spectrum analyzers traditionally have a sweep time that is proportional to the span, as defined by $$k = TB^2/S,$$

where T is the sweep time, B is the resolution bandwidth, S is the span, and k is a constant. When designing a spectrum analyzer, a designer must choose a default value for k. Traditionally, most applications utilize the constant k set at a value between 1 and 5. If the chosen value for k is too high, the instrument will be too slow. If the chosen value of k is too low, the dynamic range and filter shape display deficiencies.

The deficiencies in the filter output are caused by the LO sweep. Data points at the beginning of the filter range are mixed with a different frequency than data points at the end of the filter range. If the filter length is 1 ms in the time domain, and the sweep ramps 1 kHz in 1 ms, then the beginning point and the end point of the filter would have a 1 kHz difference in the frequencies they represented. If the sweep ramped quickly, the large frequency difference across the beginning and the end of the filter would be considerable. Such a rapid sweep introduces phase errors into the swept filter signal. As a result, the swept filter output loses peak amplitude, widens, and loses shape factor, thereby reducing the utility of the resulting filtered signal.

One approach that has been taken to overcome the sweep rate limitations of traditional swept analysis instruments is to post-process the IF signal to compensate for fast sweeping errors introduced by the LO sweep. One such method is discussed in U.S. Pat. No. 5,117,179 (hereinafter the '179 patent), which is herein incorporated by reference.

In the '179 patent, the amplitude loss and frequency shift is dealt with by predicting the loss and applying a compensating sweep-dependent gain or shift. In FIG. 2, the compensating gain is implemented in correction circuitry 46 after the real filter 45. According to the '179 patent, the compensation for the lost gain may be provided by computing the solution of a swept Guassian response used in the circuit, using a computer model of the actual filter in the circuit, or measuring the actual compensation needed in the spectrum analyzer system. The frequency shift may be compensated in a similar post-processing manner as the lost gain. In such methods, an optimal sweep rate is claimed for Gaussian filters that optimizes the signal to noise ratio for a given sweep time. However, at faster rates the analyzer still exhibits amplitude loss, frequency shifting, and reduced signal to noise ratio characteristics.

The post processing compensation method of correcting swept filters has several disadvantages. The method requires extra hardware to implement the post processing. As faster sweep rates are used, more distortion is produced by the filter and more processing is required to restore the filter output. Even with the extra processing and hardware, it would be very difficult to accurately compensate for both "noise-like" signals and CW signals. Further, as the sweep rate is increased with this method the signal to noise ratio decreases.

What is needed is a swept spectrum analyzer that sweeps frequency arbitrarily fast without creating distortions in the filter output and without decreasing the signal-to-noise ratio.

SUMMARY OF THE INVENTION

The present invention solves deficiencies of the prior art by removing a quadratic component of the phase change present in the IF signal. A quadratic component of the phase change is created in the IF signal by mixing a ramping LO signal and an input signal. A quadratic component may be removed by a complex finite impulse response (FIR) filter or other method. In the case of a complex FIR filter, several taps are used to compute the filtered output. Each tap may be multiplied by a phase offset. The phase offset gives each tap a complex value, thereby allowing the filter to remove the quadratic component of the IF signal phase change.

DETAILED DESCRIPTION

The present invention solves the problem of a distorted swept filter output at fast sweep times by utilizing the filter shape to avoid swept filter deficiencies. In one embodiment of the present invention, the filter shape may be adjusted to prevent distortion by being configured to remove the phase errors introduced by the frequency sweeping. This allows the phase errors introduced by the swept filter to be completely removed while enabling the frequency to be swept at an arbitrarily fast rate. With the method of the present invention, an optimal sweep rate need not be specified since the sweep can be infinitely fast for a given bandwidth without decreasing the signal to noise ratio.

Figure 1:
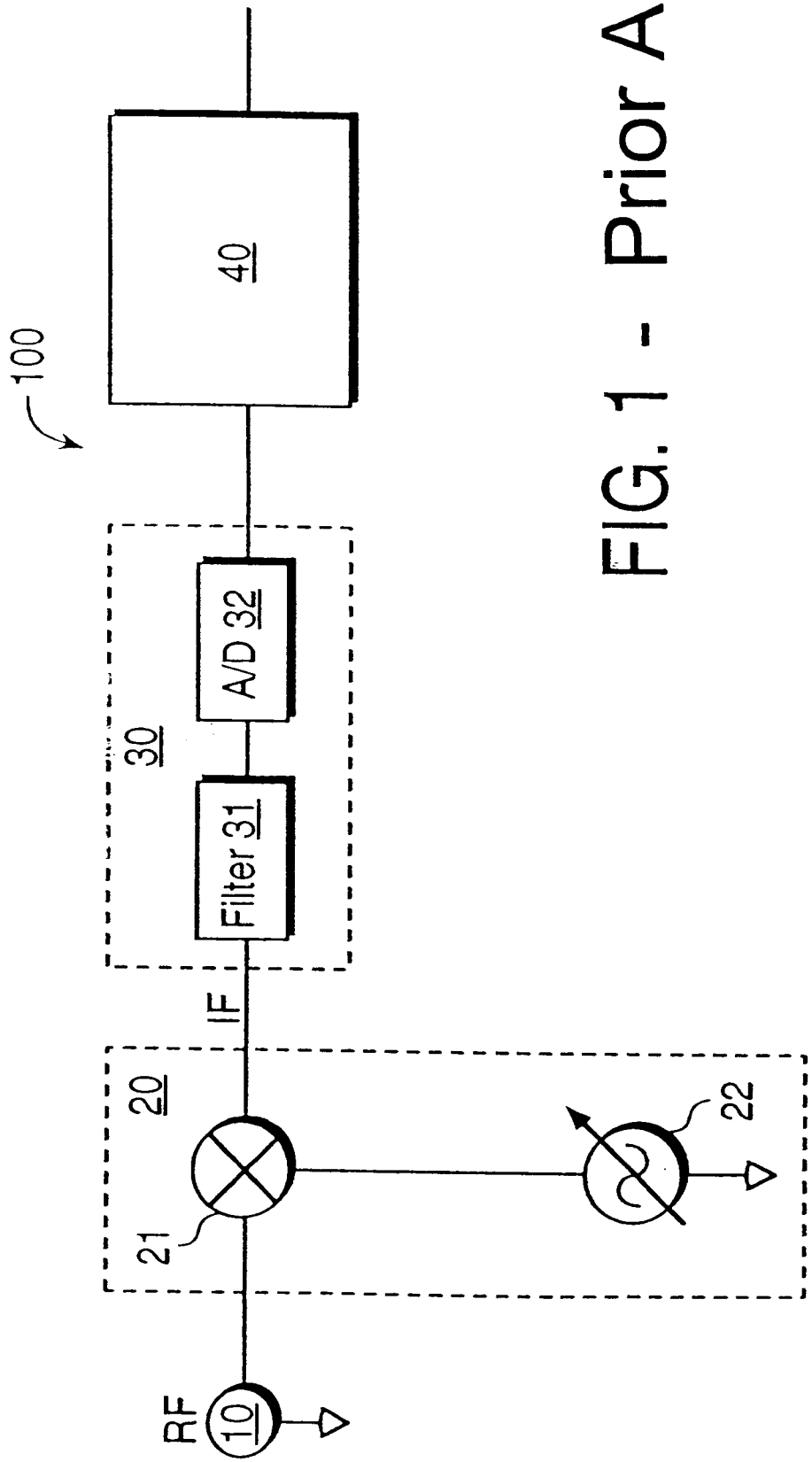
FIG. 1 is a block diagram of a typical swept spectrum analyzer.
Figure 2:
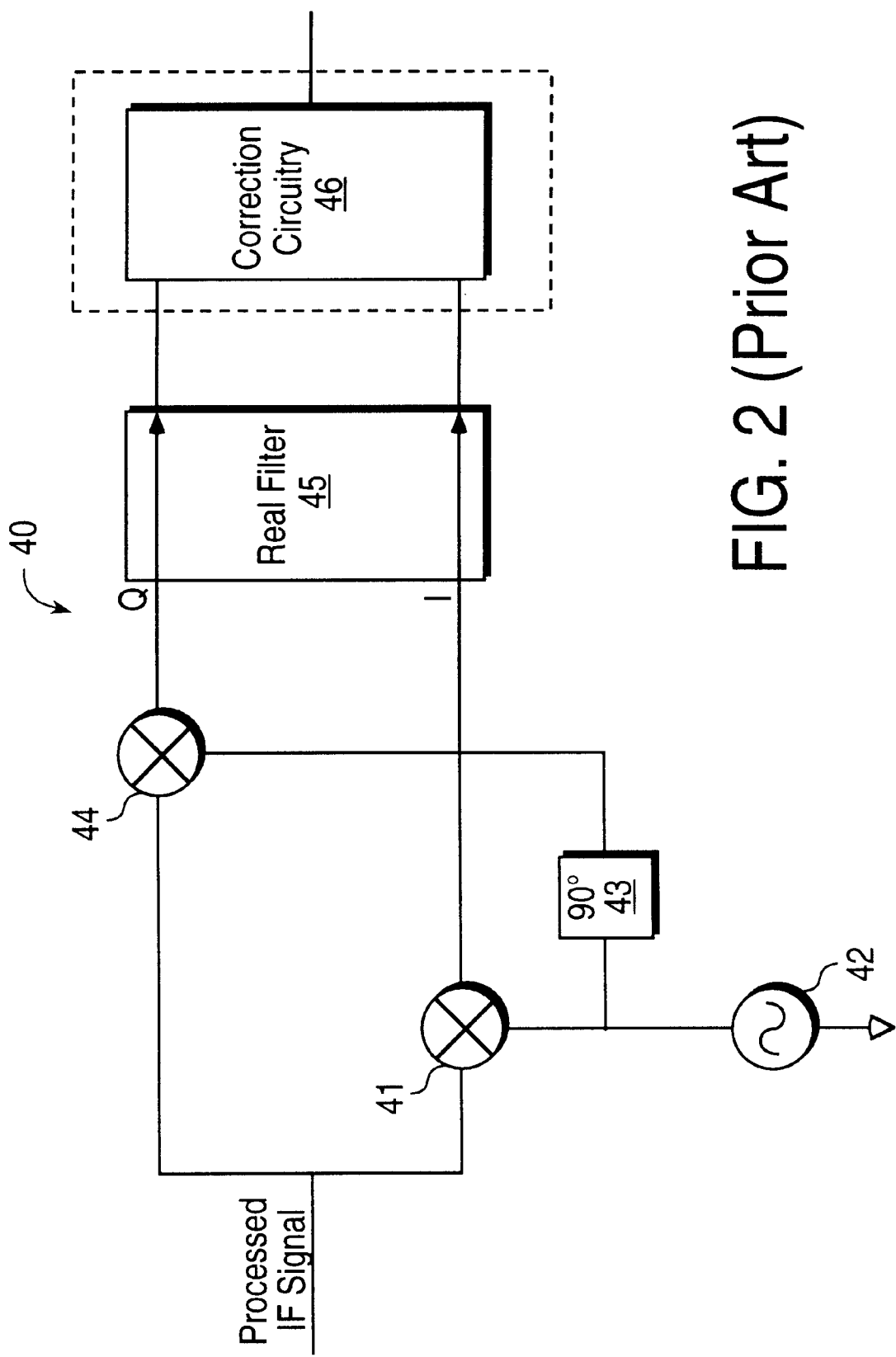
FIG. 2 is a block diagram of typical conversion circuitry of the prior art.
Figure 3:
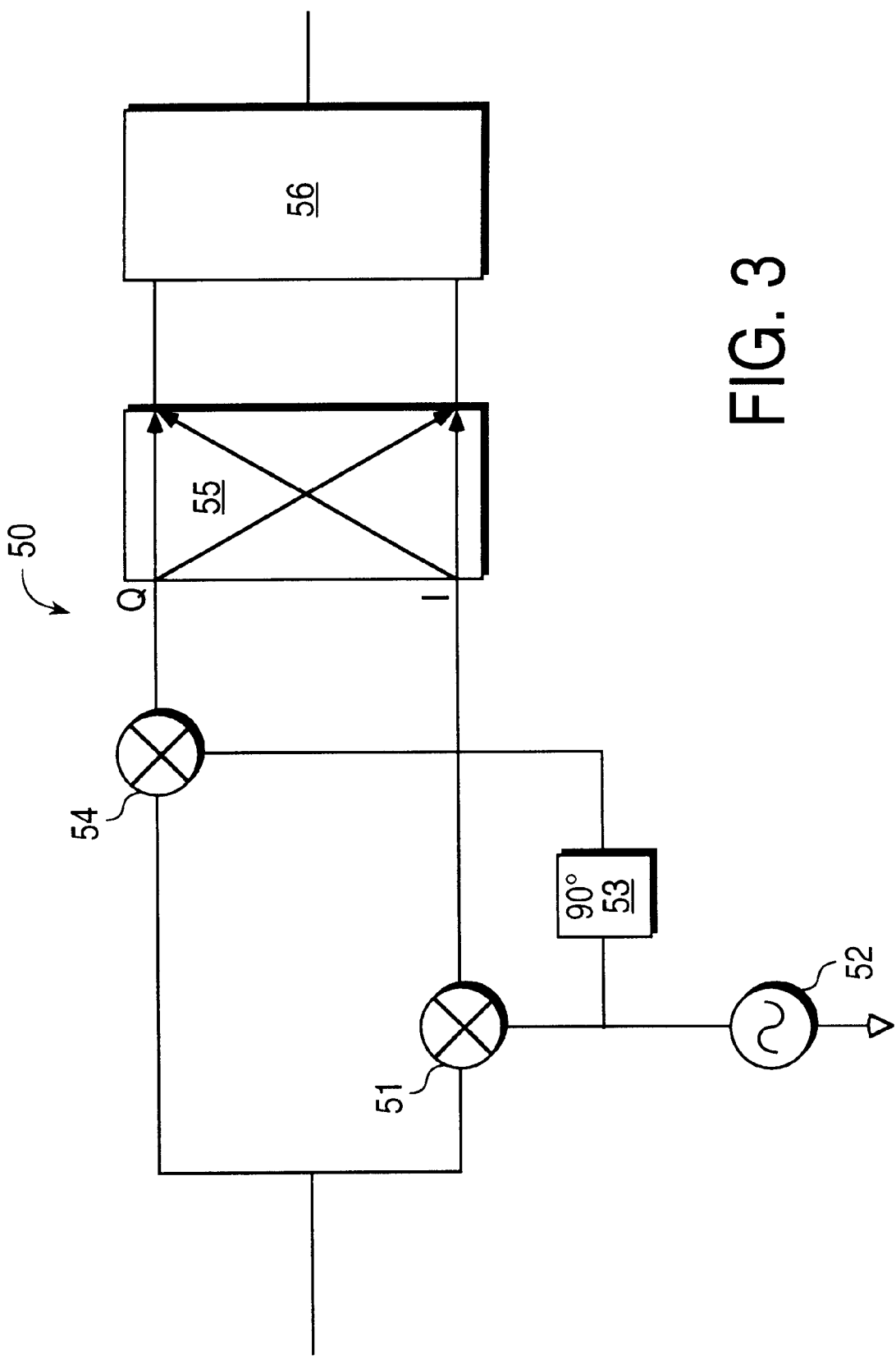
FIG. 3 is a block diagram of typical conversion circuitry in accordance with one embodiment of the present invention.

With reference to FIG. 3, an input RF signal has frequency components at $f_{RF}$ and $-f_{RF}$. The LO mixing signal from oscillator 52 has frequency components at $f_{LO}$ and $-f_{LO}$. When combined at mixer 51 or 54, the combination of the two signals forms frequency components at $-f_{RF}-f_{LO}$, $f_{FR}-f_{LO}$, $-f_{RF}+f_{LO}$, and $f_{RF}+f_{LO}$. In one embodiment, the digital mix located later in the IF processing system allows a user to select only one of these frequency components from the input signal, thus preserving the phase information of the sweep. For purposes of illustration, it is assumed that only one of the frequency components is chosen for the phase error corrections of the present invention. However, one skilled in the art will appreciate that the present invention could be applied to any frequency component of the input signal. For example, if $f_{RF}-f_{LO}$ were chosen instead of $-f_{RF}+f_{LO}$, there would simply be a 180° phase difference, and the later phase corrections would have to be in the opposite direction.

In general, the LO mix does not materially change the magnitude of the incoming signal, it only changes the phase. The magnitude change resulting in the IF signal is a result of the phase change. Accordingly, the phase change can be derived through a series of formulas. First, a constant frequency mixer would change the phase of the incoming signal linearly with time according to:

$$\Phi = f\,t + \Phi_0,$$

where f is the frequency, t is the length of time of the filter, and $\Phi_0$ is an initial phase condition not relevant to the output. If the RF input of the mixer is a sinusoid of frequency f, and the LO is a sinusoid of frequency $-f$, the phase of the signals cancel to create a constant phase DC signal. In any other case, the signals combine to form another sinusoid whose phase changes at a rate corresponding to $f_{LO}+f_{RF}$.

When the frequency input sweeps instead of remaining constant, the phase of the RF signal does not change linearly with time as is discussed above. Rather, it changes quadratically, as in:

$$\Phi = df/dt(t^2) + f_o t + \Phi_0. \tag{2}$$

As time evolves, the phase can be rewritten in terms of $(t-t_0)$, $$\Phi = df/dt(t-t_0)^2 + f_0(t-t_0) + \Phi_0, \tag{3}$$

where $t_0$ is the time the filter is looked at and $f_0$ is the frequency at a time $t_0$.

Expansion of the terms results in the quadratic expression:

$$\Phi = df/dt(t^2) + (f_0 - 2t_0(df/dt))t + C, \tag{4}$$

where C is constant. Thus, while the linear phase change component varies over time $t_0$, the quadratic phase change component remains constant over time $t_o$ with a value of $t^2\,df/dt$. The quadratic phase change component of equation 4 produces errors in the swept filter.

In accordance with the present invention, the error produced by the swept filter is corrected by offsetting the quadratic phase change component of equation 4. In one embodiment of the present invention, the quadratic portion of the phase change is removed with a filter with a phase that varies quadratically according to:

$$\Phi_f = -df/dt(t^2). \tag{5}$$

When the filter of equation 5 is convolved with an input stream whose phase varies with $+df/dt(t^2)$ such as that of equation 4, the quadratic terms cancel, leaving a signal with only a phase which varies linearly. This means that a single frequency is applied throughout the entire filter at a given point in time, rather than having a different frequency at the end and the beginning of the filter's range. At each step, the linear phase change varies as a different frequency is being looked at. However, the frequency through the filter will be constant.

In one embodiment, the variable phase change filter is implemented as a digital complex filter as part of a swept spectrum conversion circuitry. Typical conversion circuitry 50 with a variable phase change filter is shown in FIG. 3. Conversion circuitry 50 includes a first mixer 51, a signal generator 52, phase adjustment circuitry 53, a second mixer 54, and a complex filter 55. The operation of the conversion circuitry 50 shown in FIG. 3 is as follows. The processed IF signal is mixed at mixer 51 with numeric oscillator 52 to produce an in-phase signal, or I signal. The signal from numeric oscillator 52 is also processed by the phase adjustment circuitry 53 to produce a numeric oscillator signal that is 90° out of phase with the signal entering mixer 51. The signal output from the phase adjustment circuitry is then mixed at mixer 54 with the processed IF signal to produce a quadrature signal, or Q signal. The Q signal is 90° out of phase with the I signal. The I signal and Q signal are then input into and filtered by the complex filter 55. In one embodiment of the present invention, the complex filter is an FIR filter. The filtered I and Q output signals may then be processed for display. The conversion circuitry may optionally include other post processing circuitry 56, such as coordinate conversion circuitry, interleaving circuitry, or other circuitry depending on the application required and the specifications of the spectrum analyzer circuit. The post processing circuitry 56 does not require any processing to remove phase distortions present in the output of the complex filter.

The complex filter 55 includes components to obtain taps of the signal to be filtered and to process the taps in a manner similar to that of a real filter. In a real filter, a discrete time wave is processed by a FIR filter with real taps, thereby producing real outputs and a frequency response that is symmetric around zero. Unlike a real filter, a complex filter has complex taps and multiplies the incoming signal by both a real and imaginary element. Thus, each tap on both the I and Q element may contribute to both the real part and the imaginary part of the output. When the input signal points are complex as well, the frequency response is not necessarily centered about zero.

Referring to FIG. 3, the signal coming out of the numeric mixer is complex. If the taps of the filter are then made complex by multiplying them with a phase offset, the phase offsets can then cancel the unwanted phase distortion produced by the sweeping LO, represented as the quadratic term in equation 4. In determining the phase offset, only the ramping rate of the LO, df/dt in equation 4, need be known to choose the filter co-efficients.

Although the present invention has been described above with particularity, this was merely to teach one of ordinary skill in the art how to make and use the invention. Additional modifications will fall within the scope of the invention, as that scope is defined by the following claims.

What is claimed is:

1. A method of swept spectral analysis comprising the steps of:

mixing a ramping local oscillator and an RF input signal to form an IF signal, the IF signal having a quadrature signal, an in-phase signal, and a phase change with respect to the input signal, the phase change having a quadratic component; and processing the IF signal such that the quadratic component of the phase change is removed, wherein processing the IF signal includes filtering the IF signal using a complex IF filter to remove the quadratic portion, the quadrature signal and the in-phase signal both filtered by the complex IF filter.

2. The method as claimed in claim 1 wherein processing the IF signal includes adding the outputs of the filtered quadrature signal and in-phase signal together.

3. The method as claimed in claim 2 wherein the complex filter is a FIR filter.

4. The method as claimed in claim 2 wherein the complex filter includes a plurality of taps, the plurality of taps each having a phase offset, the plurality of phase offsets used to filter the quadratic portion of the phase change.

5. A swept spectral analysis system comprising:

signal mixing circuitry configured to receive an input signal and a ramping local oscillator signal and configured to output a IF signal, the IF signal having a phase change with respect to the input signal, the phase change having a quadratic component; and conversion circuitry configured to receive and convert the IF signal into an in-phase signal and a quadrature signal, said conversion circuitry including a complex filter, the in-phase signal and the quadrature signal both filtered by the complex filter, said conversion circuitry removing the quadratic phase change from the IF signal.

6. The swept spectral analysis system as claimed in claim 5 wherein said conversion circuitry adds the outputs of the filtered quadrature signal and in-phase signal.

7. The swept spectral analysis system as claimed in claim 6 wherein the complex filter is a FIR filter.

8. The swept spectral analysis system of claim 6 wherein the complex filter includes a plurality of taps each having a phase offset, the plurality of phase offsets used to filter the quadratic portion of the phase change.

* * * * *